(12) United States Patent
Tani

(10) Patent No.: US 7,042,023 B2
(45) Date of Patent: May 9, 2006

(54) SEMICONDUCTOR LIGHT EMITTING DEVICE AND METHOD FOR PRODUCING THE SAME

(75) Inventor: Kentaro Tani, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/625,234

(22) Filed: Jul. 22, 2003

(65) Prior Publication Data

US 2004/0140477 A1 Jul. 22, 2004

(30) Foreign Application Priority Data

Jul. 23, 2002 (JP) .............................. 2002-213927

(51) Int. Cl.
*H01L 21/00* (2006.01)
*H01L 33/00* (2006.01)
(52) U.S. Cl. .................. 257/102; 257/101; 438/22; 438/37
(58) Field of Classification Search ................ 257/102; 348/46
See application file for complete search history.

(56) References Cited

U.S. PATENT DOCUMENTS

| | | | | |
|---|---|---|---|---|
| 5,400,740 A | * | 3/1995 | Goto et al. ................ 117/91 |
| 5,636,237 A | * | 6/1997 | Terakado et al. ............ 372/46 |
| 5,656,539 A | * | 8/1997 | Motoda et al. .............. 438/39 |
| 5,888,844 A | * | 3/1999 | Bestwick et al. ............ 438/46 |
| 6,181,723 B1 | * | 1/2001 | Okubo et al. ............... 372/45 |
| 6,249,140 B1 | * | 6/2001 | Shigihara .................. 324/767 |
| 6,351,480 B1 | * | 2/2002 | Akagi .................... 372/45.01 |
| 6,387,721 B1 | * | 5/2002 | Hashimoto et al. .......... 438/46 |
| 6,518,159 B1 | * | 2/2003 | Tsunoda .................... 438/604 |
| 6,707,834 B1 | * | 3/2004 | Hosoba et al. .............. 372/46 |
| 2002/0187577 A1 | * | 12/2002 | Sakata et al. ............... 438/39 |
| 2003/0021320 A1 | * | 1/2003 | Kan ........................ 372/46 |
| 2003/0128730 A1 | * | 7/2003 | Ohkubo ..................... 372/46 |

FOREIGN PATENT DOCUMENTS

| | | | |
|---|---|---|---|
| EP | 1104058 | * | 5/2001 |
| JP | 1-251684 | * | 10/1989 |
| JP | 05-175609 | | 7/1993 |
| JP | 07-307528 | | 11/1995 |
| JP | 10-139588 | | 5/1998 |
| JP | 2001-053011 | | 2/2001 |
| JP | 2001-144383 | * | 5/2001 |
| JP | 2001-196694 | * | 7/2001 |

* cited by examiner

*Primary Examiner*—Nathan J. Flynn
*Assistant Examiner*—Ahmed N. Sefer
(74) *Attorney, Agent, or Firm*—Morrison & Foerster LLP

(57) ABSTRACT

A semiconductor light emitting device includes a semiconductor substrate; a stacked semiconductor structure formed on the semiconductor substrate; a striped ridge structure; and a semiconductor current confinement layer provided on a side surface of the striped ridge structure. The stacked semiconductor structure includes a first semiconductor clad layer, a semiconductor active layer, a second semiconductor clad layer, and a semiconductor etching stop layer. The striped ridge structure includes a third semiconductor clad layer, a semiconductor intermediate layer, and a semiconductor cap layer. The striped ridge structure is provided on the semiconductor etching stop layer. An interface between the semiconductor current confinement layer and the semiconductor etching stop layer and an interface between the semiconductor current confinement layer and the striped ridge structure each have a content of impurities of less than $1 \times 10^{17}/cm^3$.

4 Claims, 5 Drawing Sheets

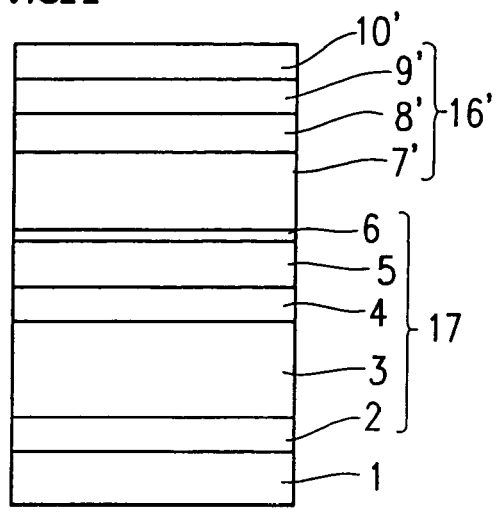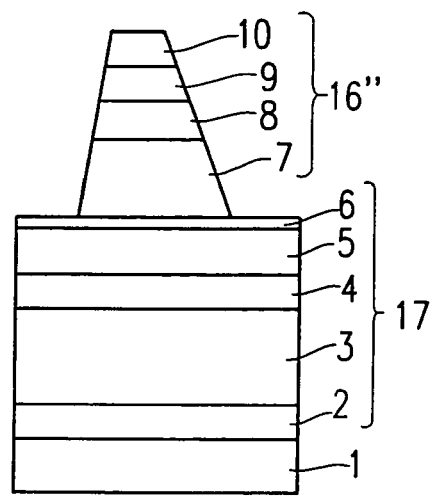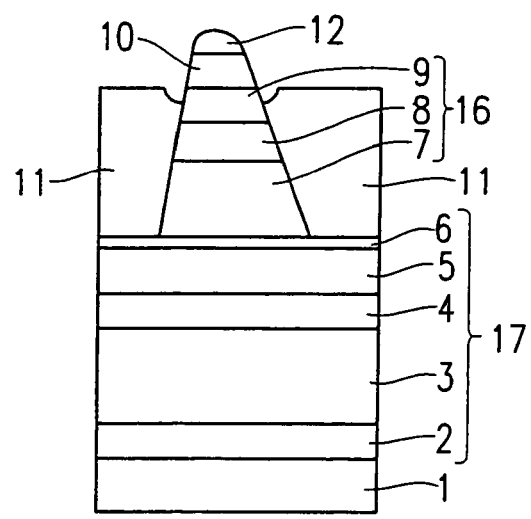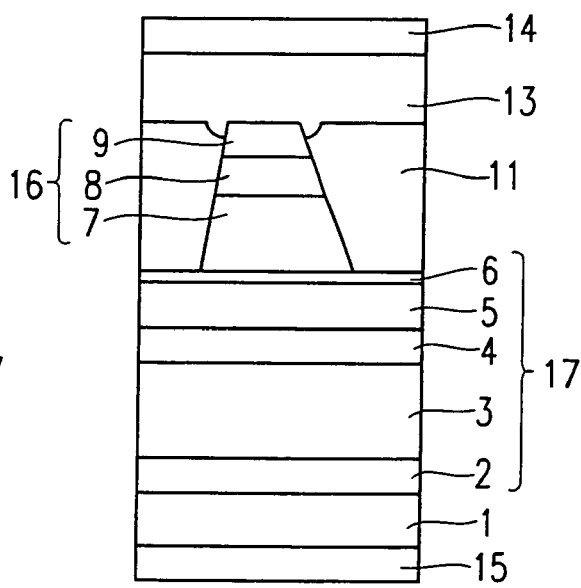

"RELATED ART"

"RELATED ART"

"RELATED ART"

"RELATED ART"

SEMICONDUCTOR LIGHT EMITTING DEVICE AND METHOD FOR PRODUCING THE SAME

BACKGROUND OF THE INVENTION

1. Field of the Invention

The present invention relates to a semiconductor light emitting device used for an optical recording apparatus, an optical transmission apparatus or the like, and a method for producing the same.

2. Description of the Related Art

Recently, optical recording apparatuses and optical transmission apparatuses have been used in various apparatuses in information related fields. Semiconductor laser devices used as semiconductor light emitting devices in these optical recording apparatuses and optical transmission apparatuses have been required to have high performances in terms of speed, output and the like.

As devices in information related fields are used more and more in households, the semiconductor laser devices used in these optical recording apparatuses and optical transmission apparatuses are required to be inexpensive. For example, semiconductor laser devices used in optical recording apparatuses, for example, DVD apparatuses are especially required to have high performance at low prices.

FIGS. 5A through 5D are cross-sectional views illustrating steps of a method for producing a semiconductor laser device 200 used in a DVD apparatus.

As shown in FIG. 5A, an n-type GaInP buffer layer 102, an n-type first AlGaInP clad layer 103, an undoped GaInP/AlGaInP strained multiple quantum well active layer 104, a p-type second AlGaInP clad layer 105, a p-type GaInP etching stop layer 106, a p-type third AlGaInP clad layer 107', a p-type GaInP intermediate layer 108', and a p-type GaAs cap layer 109' are formed in a stacking manner in this order on an n-type GaAs substrate 101 by molecular beam epitaxy (MBE). Then, an $Al_2O_3$ layer 110' is formed on the p-type GaAs cap layer 109' by electron beam (EB) deposition.

Next, as shown in FIG. 5B, the p-type third AlGaInP clad layer 107', the p-type GaInP intermediate layer 108', the p-type GaAs cap layer 109', and the $Al_2O_3$ layer 110' are processed with photolithography and etching, thereby forming a striped ridge structure including a p-type third AlGaInP clad layer 107, a p-type GaInP intermediate layer 108, a p-type GaAs cap layer 109, and an $Al_2O_3$ layer 110. The striped ridge structure is formed in a central area of a top surface of the p-type GaInP etching stop layer 106.

As shown in FIG. 5C, the structure on the n-type GaAs substrate 101 is entirely rinsed with a sulfuric acid-based rinsing solution, and then washed with pure water. An n-type AlInP current confinement layer 111 is formed on the p-type GaInP etching stop layer 106 so as to cover the striped ridge structure by MBE. This step forms an unnecessary layer 112 of n-type AlInP on the $Al_2O_3$ layer 110.

As shown in FIG. 5D, the $Al_2O_3$ layer 110 and the unnecessary layer 112 are removed. A p-type GaAs contact layer 113 is formed on the p-type GaAs cap layer 109 and the n-type AlInP current confinement layer 111. Then, a p-type electrode 114 is formed on the p-type GaAs contact layer 113, and an n-type electrode 115 is formed on a bottom surface of the n-type GaAs substrate 101.

In this manner, the semiconductor laser device 200 having a waveguide with a buried ridge structure is produced.

The above-described method for producing the semiconductor laser device 200 has the following problems.

Depending on the process conditions, the oscillation threshold current Ith, which is a starting point of laser oscillation, may be increased, which causes variability in the production yield of the semiconductor laser devices. This is a cause of the increased cost of semiconductor laser devices. In addition, as the oscillation threshold current Ith is increased, the malfunction rate of the semiconductor laser device is increased when continuously used for a long period of time and thus the reliability is lowered.

SUMMARY OF THE INVENTION

According to one aspect of the invention, a semiconductor light emitting device includes a semiconductor substrate; a stacked semiconductor structure formed on the semiconductor substrate; a striped ridge structure; and a semiconductor current confinement layer provided on a side surface of the striped ridge structure. The stacked semiconductor structure includes a first semiconductor clad layer, a semiconductor active layer, a second semiconductor clad layer, and a semiconductor etching stop layer. The striped ridge structure includes a third semiconductor clad layer, a semiconductor intermediate layer, and a semiconductor cap layer. The striped ridge structure is provided on the semiconductor etching stop layer. An interface between the semiconductor current confinement layer and the semiconductor etching stop layer and an interface between the semiconductor current confinement layer and the striped ridge structure each have a content of impurities of less than $1 \times 10^{17}/cm^3$.

In one embodiment of the invention, the impurities are carbon-based impurities.

In one embodiment of the invention, the impurities are oxygen-based impurities.

In one embodiment of the invention, the impurities are carbon-based impurities and oxygen-based impurities.

According to another aspect of the invention, a method for producing a semiconductor light emitting device includes the steps of forming a first stacked semiconductor structure on a semiconductor substrate, the first stacked semiconductor structure including a first semiconductor clad layer, a semiconductor active layer, a second semiconductor clad layer and a semiconductor etching stop layer; forming a second stacked semiconductor structure on the semiconductor etching stop layer, the second stacked semiconductor structure including a third semiconductor clad layer, a semiconductor intermediate layer and a semiconductor cap layer; forming an oxide layer on the second stacked semiconductor structure; processing at least the second stacked semiconductor structure into a striped ridge structure; washing the first stacked semiconductor structure and the striped ridge structure with a washing liquid having a prescribed resistivity; and forming a semiconductor current confinement layer on a side surface of the striped ridge structure.

In one embodiment of the invention, the prescribed resistivity is higher than 1 MΩm.

In one embodiment of the invention, the washing liquid is pure water.

In one embodiment of the invention, the prescribed resistivity is higher than 1 MΩm.

According to a semiconductor light emitting device of the present invention, the interface between the semiconductor current confinement layer and the semiconductor etching stop layer and the interface between the semiconductor current confinement layer and the ridge structure each have an impurity content of less than $1 \times 10^{17}/cm^3$. Therefore, absorption of light by the impurities is suppressed, the oscillation threshold current Ith is stable without being abnormally increased, the malfunction rate when continuously used for a long period of time is lowered, and the reliability is improved.

Thus, the invention described herein makes possible the advantages of providing a semiconductor light emitting device for suppressing the increase in the oscillation threshold current Ith and improving the reliability, and a method for producing the same.

These and other advantages of the present invention will become apparent to those skilled in the art upon reading and understanding the following detailed description with reference to the accompanying figures.

BRIEF DESCRIPTION OF THE DRAWINGS

FIGS. 2A through 2D are cross-sectional views illustrating a method for producing the semiconductor laser device shown in FIG. 1;

DESCRIPTION OF THE PREFERRED EMBODIMENTS

Figure 1:
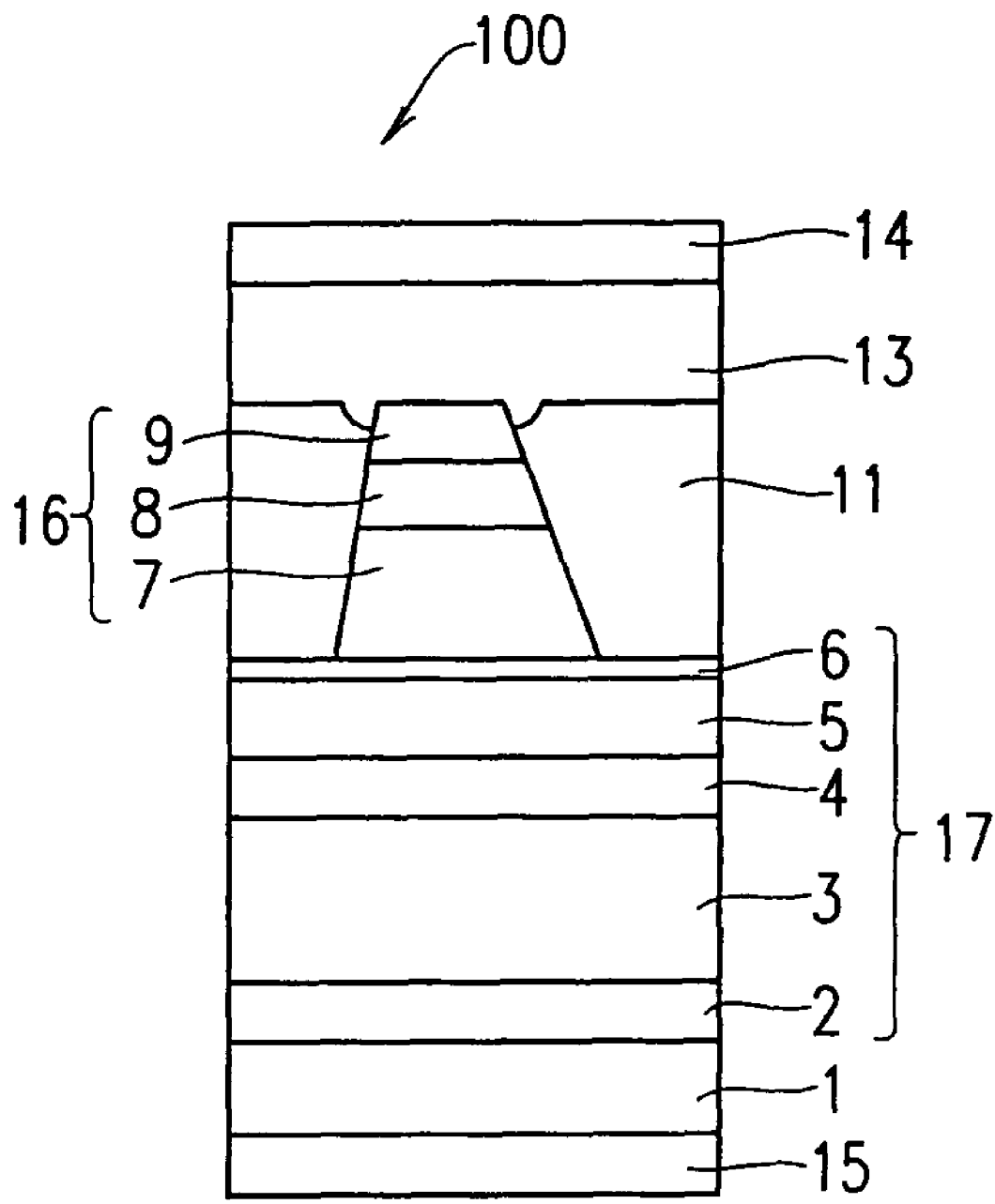
FIG. 1 is a cross-sectional view of a semiconductor laser device according to an example of the present invention.

Samples of each layer of the semiconductor laser device 200 produced by the method shown in FIG. 5A through 5D were analyzed in terms of crystalline state and the like using a SIMS (secondary ion mass spectrometer) and the like. The following was found.

In a semiconductor laser device of a lot having an abnormally high oscillation threshold current Ith, the content of carbon-based impurities and oxygen-based impurities at the interface between the n-type AlInP current confinement layer 111 and the p-type GaInP etching stop layer 106 and the interface between the n-type AlInP current confinement layer 111 and the striped ridge structure 116 (more specifically, the re-growth interface area of the n-type AlInP current confinement layer 111) was confirmed to be higher than that of a semiconductor laser device of a lot having a normal oscillation threshold current Ith.

It was also confirmed that the content of the carbon-based impurities and oxygen-based impurities in the re-growth interface area of the n-type AlInP current confinement layer 111 was closely related to the resistivity of pure water used for washing. The resistivity of pure water represents the purity of the pure water. As described above, washing with pure water is performed after rinsing with a sulfuric acid-based rinsing solution before the n-type AlInP current confinement layer 111 is formed (re-grown).

Figure 3A:
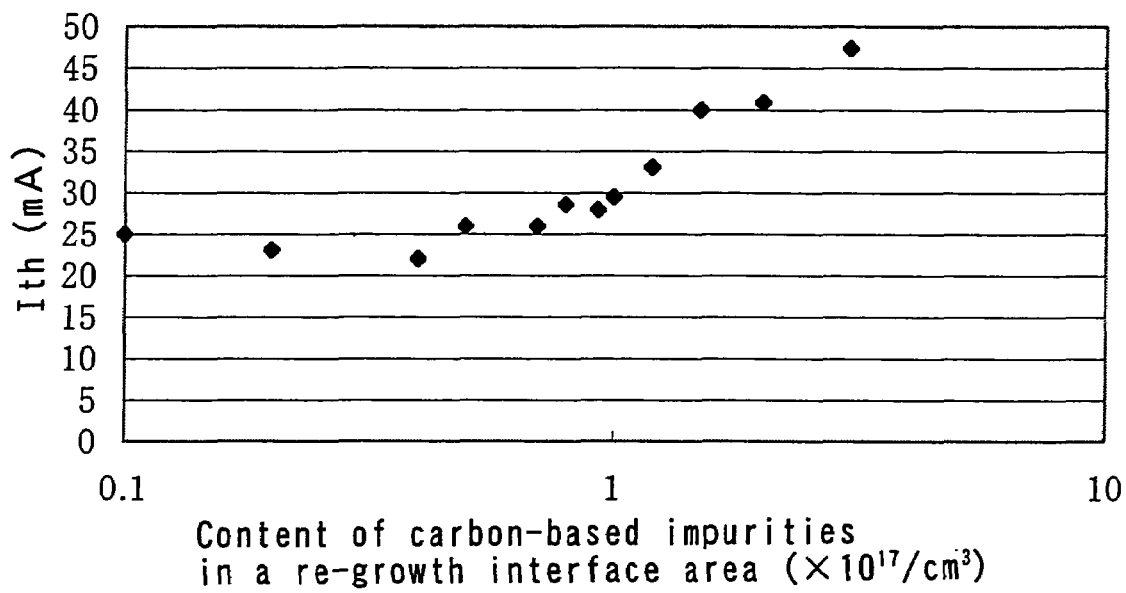
FIG. 3A is a graph illustrating the correlation between the content of carbon-based impurities in a re-growth interface area of an n-type AlInP current confinement layer of a semiconductor laser device and the oscillation threshold current Ith of the semiconductor laser device.
Figure 3B:
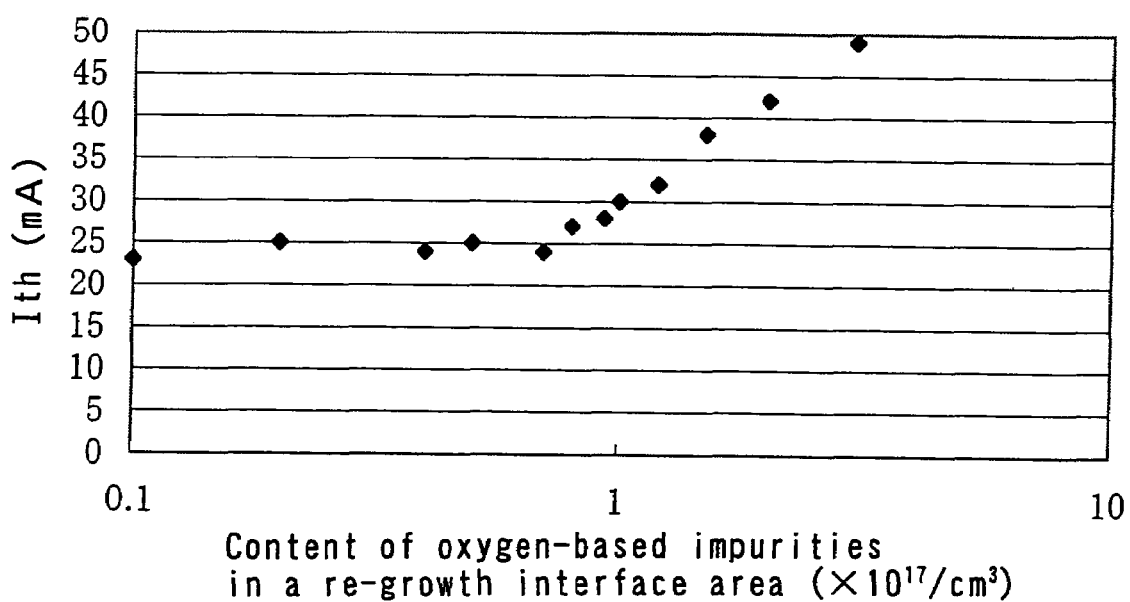
FIG. 3B is a graph illustrating the correlation between the content of oxygen-based impurities in the re-growth interface area of the n-type AlInP current confinement layer of a semiconductor laser device and the oscillation threshold current Ith of the semiconductor laser device.

FIG. 3A is a graph illustrating the correlation between the oscillation threshold current Ith of the manufactured semiconductor laser device 200 and the content of carbon-based impurities in the re-growth interface area of the n-type AlInP current confinement layer 111. FIG. 3B is a graph illustrating the correlation between the oscillation threshold current Ith of the manufactured semiconductor laser device 200 and the content of oxygen-based impurities in the re-growth interface area of the n-type AlInP current confinement layer 111.

As shown in FIG. 3A, when the content of carbon-based impurities in the re-growth interface area of the n-type AlInP current confinement layer 111 is lower than $1 \times 10^{17}/cm^3$, the oscillation threshold current Ith is stable at around 25 mA.

As shown in FIG. 3B, when the content of oxygen-based impurities in the re-growth interface area of the n-type AlInP current confinement layer 111 is lower than $1 \times 10^{17}/cm^3$, the oscillation threshold current Ith is stable at around 25 mA.

When the content of carbon-based impurities and the content of oxygen-based impurities in the re-growth interface area of the n-type AlInP current confinement layer 111 are each higher than or equal to $1 \times 10^{17}/cm^3$, the oscillation threshold current Ith significantly increases.

Figure 4A:
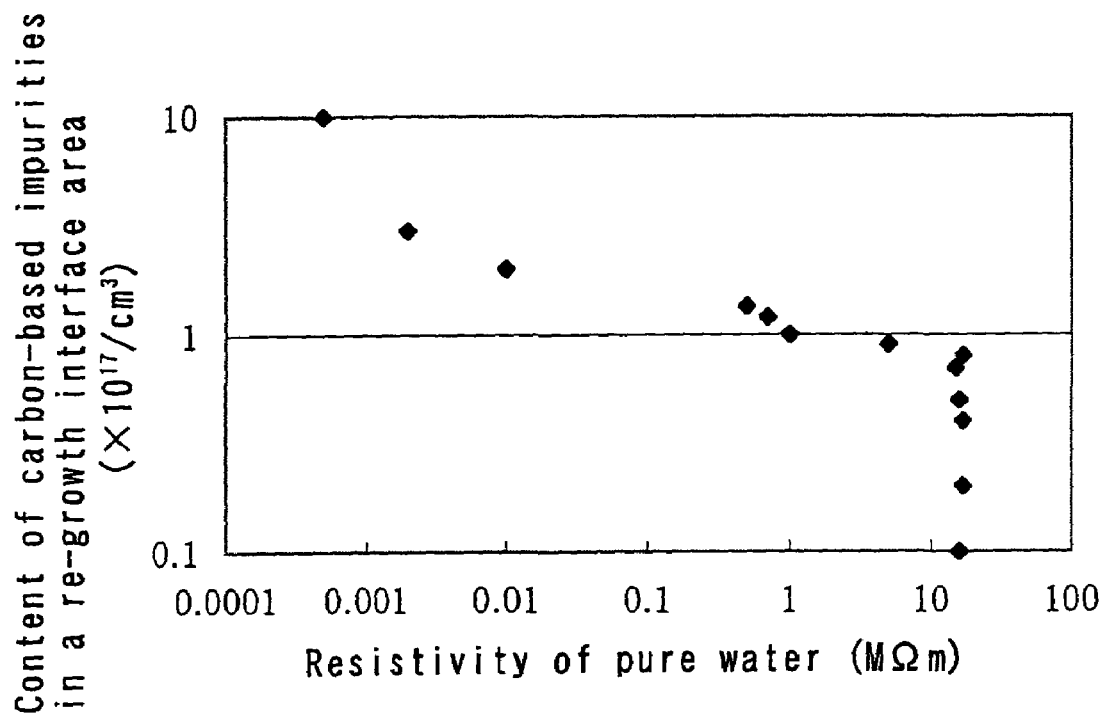
FIG. 4A is a graph illustrating the correlation between the content of carbon-based impurities in the re-growth interface area of the n-type AlInP current confinement layer of a semiconductor laser device and the resistivity of pure water used for producing the semiconductor laser device.
Figure 4B:
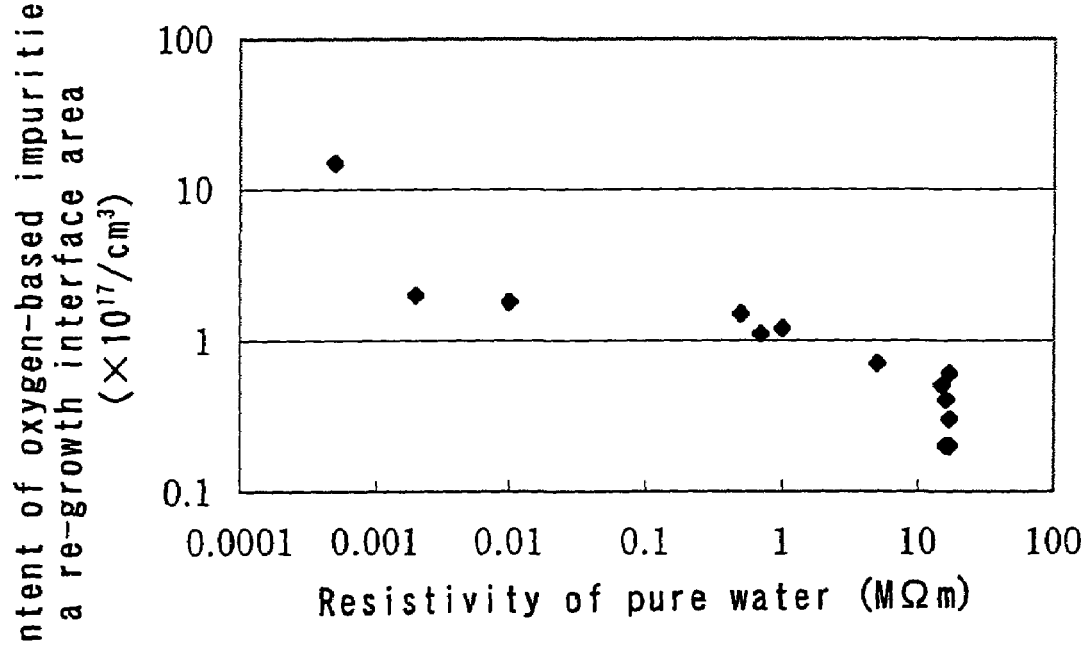
FIG. 4B is a graph illustrating the correlation between the content of oxygen-based impurities in the re-growth interface area of the n-type AlInP current confinement layer of a semiconductor laser device and the resistivity of pure water used for producing the semiconductor laser device.
Figure 5A:
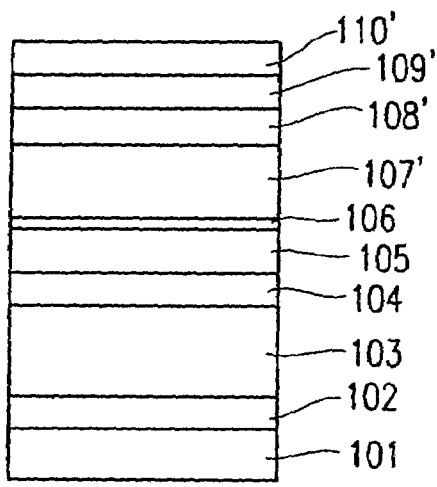
FIGS. 5A through 5D are cross-sectional views illustrating a method for producing a semiconductor laser device.
Figure 5B:
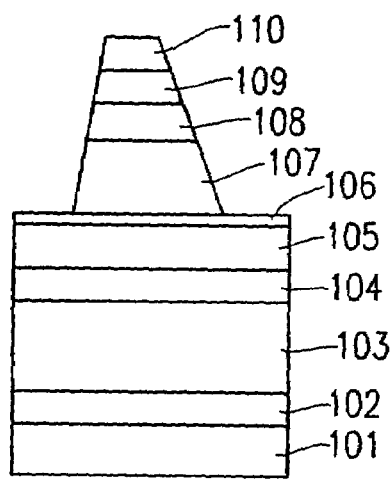
Figure 5C:
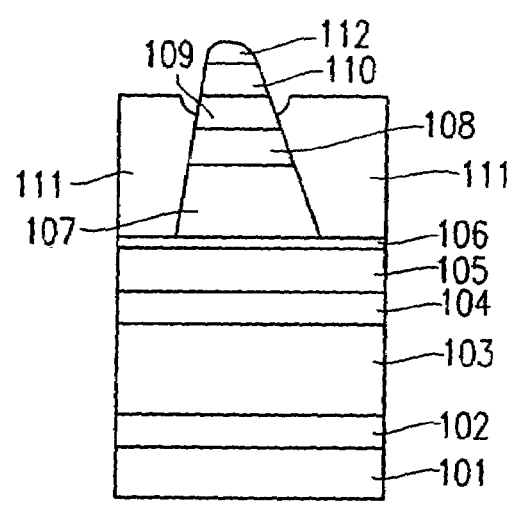
Figure 5D:
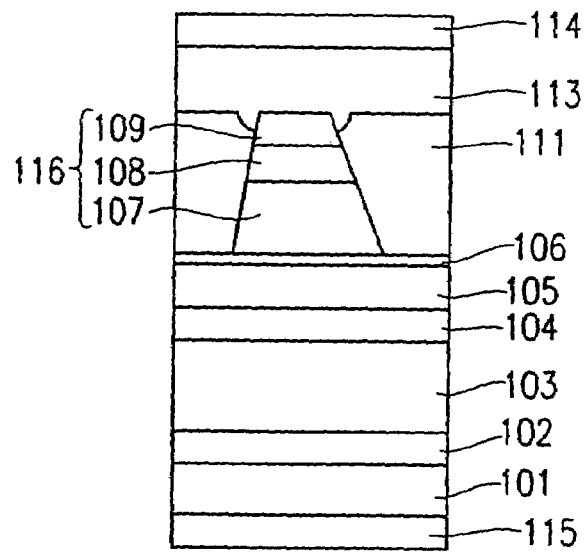

FIG. 4A is a graph illustrating the relationship between the content of carbon-based impurities in the re-growth interface area of the n-type AlInP current confinement layer 111 and the resistivity of pure water. FIG. 4B is a graph illustrating the relationship between the content of oxygen-based impurities in the re-growth interface area of the n-type AlInP current confinement layer 111 and the resistivity of pure water.

As shown in FIGS. 4A and 4B, when the resistivity of pure water is higher than 1 MΩm, the content of carbon-based impurities and the content of oxygen-based impurities in the re-growth interface area of the n-type AlInP current confinement layer 111 are each less than $1 \times 10^{17}/cm^3$. When the resistivity of pure water is lower than or equal to 1 MΩm, the content of carbon-based impurities and the content of oxygen-based impurities in the re-growth interface area of the n-type AlInP current confinement layer 111 are each higher than or equal to $1 \times 10^{17}/cm^3$.

Thus, it was confirmed that the increase in the oscillation threshold current Ith is suppressed by maintaining the resistivity of pure water at a value higher than 1 MΩm.

One example of the carbon-based impurities is carbon dioxide, and one example of the oxygen-based impurities is phosphoric acid.

Hereinafter, the present invention will be described by way of illustrative examples with reference to the accompanying drawings.

FIG. 1 is a cross-sectional view of a semiconductor laser device 100 as a semiconductor light emitting device according to an example of the present invention.

The semiconductor laser device 100, as an exemplary semiconductor light emitting device, includes an n-type GaAs substrate 1, a stacked semiconductor structure 17 provided on the n-type GaAs substrate 1, a striped ridge structure (waveguide) 16, an n-type AlInP current confinement layer 11 provided on side surfaces of the striped ridge structure 16, a p-type GaAs contact layer 13, a p-type electrode 14 and an n-type electrode 15.

The stacked semiconductor structure 17 includes an n-type GaInP buffer layer 2, an n-type first AlGaInP clad layer 3, an undoped GaInP/AlGaInP strained multiple quantum well active layer 4, a p-type second AlGaInP clad layer 5, and a p-type GaInP etching stop layer 6. These layers are stacked sequentially in this order.

The striped ridge structure 16 includes a p-type third AlGaInP clad layer 7, a p-type GaInP intermediate layer 8, and a p-type GaAs cap layer 9. These layers are stacked sequentially in this order. The striped ridge structure 16 is formed on a central portion of the p-type GaInP etching stop layer 6.

The n-type AlInP current confinement layer 11 is provided on the p-type GaInP etching stop layer 6 so as to cover the striped ridge structure (waveguide) 16 except for a top surface of the p-type GaAs cap layer 9. At least one of the content of carbon-based impurities and the content of oxygen-based impurities at the interface between the n-type AlInP current confinement layer 11 and the p-type GaInP etching stop layer 6 and the interface between the n-type AlInP current confinement layer 11 and the striped ridge structure 16 (more specifically, the re-growth interface area of the n-type AlInP current confinement layer 11) is less than $1\times10^{17}/cm^3$. Preferably, the total of the content of carbon-based impurities and the content of oxygen-based impurities is less than $1\times10^{17}/cm^3$.

The p-type GaAs contact layer 13 is provided on the p-type GaAs cap layer 9 and the n-type AlInP current confinement layer 11. The p-type electrode 14 is provided on the p-type GaAs contact layer 13, and the n-type electrode 15 is provided on a bottom surface of the n-type GaAs substrate 1.

In the semiconductor laser device 100 shown in FIG. 1 according to a preferred embodiment of the present invention, the total content of carbon-based impurities and oxygen-based impurities at the re-growth interface area of the n-type AlInP current confinement layer 11 is less than $1\times10^{17}/cm^3$ (alternatively, at least one of the content of carbon-based impurities and the content of oxygen-based impurities at the re-growth interface area of the n-type AlInP current confinement layer 11 is less than $1\times10^{17}/cm^3$), as described above. Therefore, the oscillation threshold current Ith is at a stable level. Since the oscillation threshold current Ith is not abnormally increased, the malfunction rate of the semiconductor laser device when continuously used for a long period of time is reduced, and thus the reliability is improved.

The semiconductor laser device 100 having the above-described structure is produced as follows as shown in FIGS. 2A through 2D.

As shown in FIG. 2A, the n-type GaInP buffer layer 2, the n-type first AlGaInP clad layer 3, the undoped GaInP/AlGaInP strained multiple quantum well active layer 4, the p-type second AlGaInP clad layer 5, and the p-type GaInP etching stop layer 6 are formed in a stacking manner in this order on the n-type GaAs substrate 1 by MBE. Thus, the stacked semiconductor structure 17 is produced. Then, a p-type third AlGaInP clad layer 7', a p-type GaInP intermediate layer 8', and a p-type GaAs cap layer 9' are formed in a stacking manner in this order on the p-type GaInP etching stop layer 6. Thus, a stacked semiconductor structure 16' is produced. Then, an $Al_2O_3$ layer 10' (oxide layer) is formed on the p-type GaAs cap layer 9' by electron beam (EB) deposition.

Next, as shown in FIG. 2B, the stacked semiconductor structure 16' and the $Al_2O_3$ layer 10' are processed with photolithography and etching, thereby forming a striped ridge structure 16" on the p-type GaInP etching stop layer 6. The striped ridge structure 16" includes the p-type third AlGaInP clad layer 7, the p-type GaInP intermediate layer 8, the p-type GaAs cap layer 9, and an $Al_2O_3$ layer 10. The striped ridge structure 16" is provided on a central portion of the p-type GaInP etching stop layer 6. The striped ridge structure 16" has a horizontal cross-section which decreases toward the top surface thereof.

As shown in FIG. 2C, the stacked semiconductor structure 17 and the striped ridge structure 16" are rinsed with a sulfuric acid-based rinsing solution, and then washed with pure water. The pure water used in this example is controlled such that the resistivity (representing the purity of the water) is higher than 1 MΩm. Then, then-type AlInP current confinement layer 11 is formed on the p-type GaInP etching stop layer 6 so as to cover the striped ridge structure 16" by MBE. This step forms an unnecessary layer 12 of n-type AlInP on the $Al_2O_3$ layer 10.

As shown in FIG. 2D, the $Al_2O_3$ layer 10 and the unnecessary layer 12 are removed. Thus, the n-type AlInP current confinement layer 11 is left on the p-type GaInP etching stop layer 6 and the side surfaces of the striped ridge structure 16 including the p-type third AlGaInP clad layer 7, the p-type GaInP intermediate layer 8, and the p-type GaAs cap layer 9. The p-type GaAs contact layer 13 is formed on the p-type GaAs cap layer 9 and the n-type AlInP current confinement layer 11. Then, the p-type electrode 14 is formed on the p-type GaAs contact layer 13, and the n-type electrode 15 is formed on the bottom surface of the n-type GaAs substrate 1.

As described above, according to the method of the present invention for producing the semiconductor laser device 100, the pure water used for washing the stacked semiconductor structure 17 and the striped ridge structure 16" has a resistivity of higher than 1 MΩm. The oscillation threshold current Ith of the semiconductor laser device 100 is about 30 mA, whereas the oscillation threshold current Ith of the semiconductor laser device produced using pure water having a resistivity of 1 MΩm or less is about 40 mA. The oscillation threshold current Ith is reduced by about 25% by the present invention. The operating current Iop of the semiconductor laser device 100 at an optical output of 7 mW at a higher temperature (80° C.) is about 50 mA, whereas the operating current Iop of the semiconductor laser device produced using pure water having a resistivity of 1 MΩm or less under the same conditions is about 70 mA. The operating current Iop is reduced by about 30% by the present invention. As a result, the operation time in which the average malfunction rate of the semiconductor laser device 100 is kept to be 1% or less is at least 10000 hours, whereas such an operation time of the semiconductor laser device produced using pure water having a resistivity of 1 MΩm or less is at least 5000 hours. The reliability is improved to about twice as high by the present invention.

The interface between the n-type AlInP current confinement layer 11 and the p-type GaInP etching stop layer 6 and the interface between the n-type AlInP current confinement layer 11 and the striped ridge structure 16 (the re-growth interface area of the n-type AlInP current confinement layer 11) was analyzed using a SIMS. The following was found.

The total content of carbon-based impurities and oxygen-based impurities is as low as less than $1\times10^{17}/cm^3$. That is to say, the effect of using pure water having a resistivity of higher than 1 MΩm is remarkably obtained. In a semiconductor laser device produced using pure water having a resistivity of less than or equal to 1 MΩm, the content of each of carbon-based impurities and oxygen-based impurities at the re-growth interface area is as high as $1\times10^{17}/cm^3$ or higher.

If the interface of a ridge structure (waveguide) or the like of a semiconductor laser device, where light is converged, contains a high content of carbon-based impurities and a high content of oxygen-based impurities, light is absorbed by these impurities. This results in deterioration of characteristics such as the oscillation threshold current Ith and the like, and generation of, for example, DLD (dark line defect) due to the energy of the light absorbed by these impurities. The dark line causes local deterioration of the ridge structure. In consequence, the reliability of the semiconductor laser device is lowered.

It was also confirmed that LEDs, and light emitting devices using other materials, for example, GaAlInN-based, AlGaAs-based, InP-based and ZnSSe-based materials, which were produced by substantially the same method as the method described in the example of the present invention with reference to FIGS. 2A through 2D, provided substantially the same effect.

As described above, according to a semiconductor light emitting device of the present invention, the interface between the semiconductor current confinement layer and the semiconductor etching stop layer and the interface between the semiconductor current confinement layer and the ridge structure each have an impurity content of less than $1\times10^{17}/cm^3$. Therefore, light absorption by impurities is suppressed, the oscillation threshold current Ith is stable without being abnormally increased, the malfunction rate when continuously used for a long period of time is lowered, and the reliability is improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting device, comprising:

a semiconductor substrate;

a stacked semiconductor structure formed on the semiconductor substrate;

a striped ridge structure; and a semiconductor current confinement layer provided on a side surface of the striped ridge structure;

wherein the stacked semiconductor structure includes a first semiconductor clad layer, a semiconductor active layer, a second semiconductor clad layer, and a semiconductor etching stop layer;

wherein the striped ridge structure includes a third semiconductor clad layer, a semiconductor intermediate layer, and a semiconductor cap layer;

wherein the striped ridge structure is provided on the semiconductor etching stop layer; and wherein an interface between the semiconductor current confinement layer and the semiconductor etching stop layer and an interface between the semiconductor current confinement layer and the striped ridge structure each have a content of impurities of less than $1\times10^{17}/cm^3$.

2. A semiconductor light emitting device according to claim 1, wherein the impurities are carbon-based impurities.

3. A semiconductor light emitting device according to claim 1, wherein the impurities are oxygen-based impurities.

4. A semiconductor light emitting device according to claim 1, wherein the impurities are carbon-based impurities and oxygen-based impurities.

* * * * *